US011069421B1

(12) United States Patent
Refaeli et al.

(10) Patent No.: US 11,069,421 B1
(45) Date of Patent: Jul. 20, 2021

(54) CIRCUITRY FOR CHECKING OPERATION OF ERROR CORRECTION CODE (ECC) CIRCUITRY

(71) Applicant: NXP USA, Inc., Austin, TX (US)

(72) Inventors: Jehoda Refaeli, Austin, TX (US); Nancy Hing-Che Amedeo, Austin, TX (US); Quyen Pho, Pflugerville, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/902,305

(22) Filed: Jun. 16, 2020

(51) Int. Cl.
*G11C 29/42* (2006.01)
*G11C 29/44* (2006.01)
*G11C 29/14* (2006.01)
*G11C 29/46* (2006.01)

(52) U.S. Cl.
CPC ............. *G11C 29/42* (2013.01); *G11C 29/14* (2013.01); *G11C 29/44* (2013.01); *G11C 29/4401* (2013.01); *G11C 29/46* (2013.01); *G11C 2029/4402* (2013.01)

(58) Field of Classification Search
CPC ......... G11C 29/42; G11C 29/44; G11C 29/14; G11C 29/46; G11C 29/4401; G11C 2029/4402
See application file for complete search history.

(56) References Cited

U.S. PATENT DOCUMENTS 4,531,213 A * 7/1985 Scheuneman ....... G06F 11/1032
714/703

FOREIGN PATENT DOCUMENTS

KR 20190042013 A 4/2019

OTHER PUBLICATIONS

With respect to the NXP Safety Manual referenced below, we do Not need to submit it as well as the ST Note covers the same information but with more detail. If it helps, the ST Note can be found online at https://www.st.com/resource/en/application_note/dm00508354-notes-on-edc-after-ecc-functionality-stmicroelectronics.pdf.

* cited by examiner

Primary Examiner — Jay W. Radke

(57) ABSTRACT

Error detection circuitry is configured to receive raw read data from a memory, perform error detection in accordance with a single-bit error correction and double-bit error detection (SECDEC) error-correction code (ECC) on the raw read data, and provide a single bit correction indicator in response to performing the SECDEC ECC on the raw read data. Error correction circuitry is configured to provide corrected read data corresponding to the raw read data based at least on the single bit correction indicator. ECC checking circuitry is configured to generate a wrong operation indicator based at least on a parity of the raw read data, a parity of the corrected read data, and the single bit correction indicator, wherein the ECC checking circuitry is configured to assert the wrong operation indicator when at least one of the error detection circuitry or the error correction circuitry is not operating correctly.

20 Claims, 2 Drawing Sheets

| | RAW Dout | CORRECTED Dout | ECC SINGLE BIT CORRECTION INDICATOR | ECC WRONG CORRECTION INDICATOR | |
|---|---|---|---|---|---|
| | 1000 | 1000 | 0 | 0 | ~32 |
| | 1000 | 1001 | 0 | 1 | ~34 |
| | 1000 | 1000 | 1 | 1 | ~36 |
| | 1000 | 1001 | 1 | 0 | ~38 |

CIRCUITRY FOR CHECKING OPERATION OF ERROR CORRECTION CODE (ECC) CIRCUITRY

BACKGROUND

Field

This disclosure relates generally to integrated circuits, and more specifically, to circuitry for checking operation of error correction code (ECC) circuitry.

Related Art

Error correction code (ECC) circuitry is commonly used to detect and correct various kinds of data corruption. For example, ECC circuitry can be used to determine data corruption in read data obtained upon read accesses from a corresponding memory. One type of commonly used ECC is single-bit error correction and double-bit error detection (SECDED) ECC. In this case, ECC circuitry can provide single bit error detection and correction such that read data from a memory with only a one bit error can be corrected and provided as the corrected read data. With SECDED ECC, the ECC circuitry is also capable of detecting a double-bit error, but cannot correct the double-bit error. The SECDED ECC can be performed using known error-correction codes, such as, for example, Hamming codes. However, it is possible for the ECC circuitry itself to fail. For example, the ECC circuitry may correct a piece of data incorrectly, may correct a piece of data without indicating the occurrence of such correction, or may indicate a correction for the piece of data but not perform the correction. This can result in incorrect operation by any block in an IC relying on the read data. Therefore, a need exists for a mechanism to check operation of ECC circuitry.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

ECC circuitry coupled to a memory is configured to provide, upon a read access, error detection, and if possible, error correction for the retrieved read data. In one embodiment, using the retrieved raw read data, the corrected read data, and an ECC error indicator, ECC operation checking circuitry can verify whether the ECC circuitry is operating as expected or the ECC circuitry is not operating correctly. For example, in one embodiment, a comparison of the parities of the raw data and the corrected data is used in combination with an ECC single bit correction indicator to determine whether or not the ECC circuitry is operating correctly.

Figure 1:
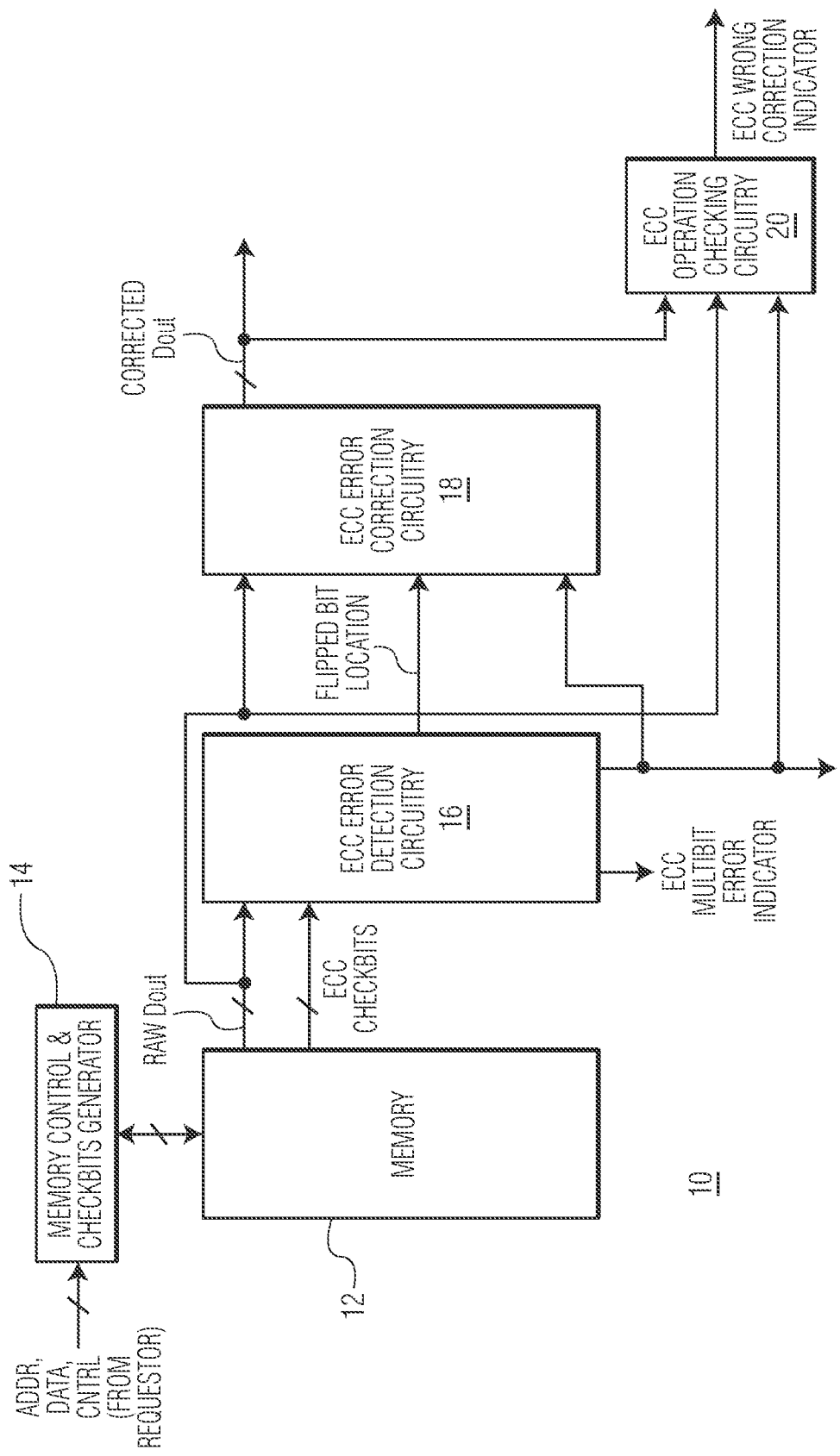
FIG. 1 illustrates, in block diagram form, a memory system which implements ECC, in accordance with one embodiment of the present invention.

FIG. 1 illustrates, in block diagram form, a memory system 10 in accordance with one embodiment of the present invention. Memory system 10 includes a memory 12, memory control and checkbits generator 14, ECC error detection circuitry 16, ECC error correction circuitry 18, and ECC operation checking circuitry 20 (also referred to as ECC checking circuitry). Memory control and checkbits generator 14 receives access requests from a requestor (not illustrated in FIG. 1) for memory 12. An access request can either be a read access request or a write access request, and includes an access address (addr), write data (if the access request is a write access request), and corresponding control information (including, for example, a read/write (R/W) indicator). The requestor can be any master device coupled to memory system 10, such as, for example, a processor, direct memory access (DMA) controller, peripheral device, etc. Memory control and checkbits generator 14 communicates with memory 12 to complete the access requests. Memory 12 can be any type of memory, such as, for example, a random access memory (RAM).

Memory 12 provides raw output data (Dout) to ECC error detection circuitry 16, ECC error correction circuitry 18, and ECC operation checking circuitry 20. Memory 12 also provides ECC checkbits to ECC error detection circuitry 16. ECC error detection circuitry 16 provides an ECC multibit error indicator, an ECC single bit correction indicator to both ECC error correction circuitry 18 and ECC operation checking circuitry 20, and a flipped bit location to ECC error correction circuitry 18. ECC error correction circuitry 18 provides corrected output data (Dout) to ECC operation checking circuitry 20. ECC operation checking circuitry 20, based on raw Dout, corrected Dout, and ECC single bit correction indicator, provides an ECC wrong correction indicator, which, when asserted to a logic level one, indicates a wrong ECC correction.

In operation, memory system 10 implements ECC on data stored in memory 12. In the illustrated embodiment, memory system 10 implements SECDED ECC in which a single bit error can be both detected and corrected, and a double bit (or multibit) error can be detected (but not corrected). Any known error-correction code can be used to perform the SECDED ECC, such as, for example, a hamming code.

For memory system 10, each write access to memory 10 stores not only write data but corresponding ECC checkbits with the write data. For example, upon receipt of a write access request, memory control and checkbits generator 14 generates corresponding ECC checkbits using the received write data, as known in the art, which are stored in memory 12 along with the write data. The write data and ECC checkbits can both be stored at the location in memory 12 indicated by the access address. In alternate embodiments, the checkbits can be stored in a separate location within memory 12 or in a separate memory. In one embodiment, each request to memory 12 reads or writes 8 bytes of data (64 bits of data), and for 64 bits of data, the corresponding ECC checkbits may include 7 bits. In this case, each 8 bytes of stored data in memory 12 has 7 corresponding checkbits. Depending on the type of error-correction code used for the ECC in memory 12, fewer or more checkbits may be required for a particular data size.

Upon a read access to memory 12, the received access address is used to access and provide the stored read data as the raw read data (raw Dout) and the corresponding ECC checkbits for the raw read data to ECC error detection circuitry 16. The raw read data corresponds to the data as read from memory 12 prior to any error detection or correction being done. Using the received raw Dout and corresponding ECC checkbits, ECC error detection circuitry 16 performs the error-correction code to detect if no error is present or if a single bit error or multibit error is present. In the case of a detected single bit error, ECC error detection circuitry 16 asserts ECC single bit correction indicator (to a logic level one), and also provides a flipped bit location corresponding to the single bit error to ECC error correction circuitry 18. If a multibit error is detected, e.g., a two-bit error, ECC error detection circuitry 16 asserts ECC multibit error indicator. In this case, since it cannot be corrected, no flipped bit location is provided. Therefore, if neither the ECC multibit error indicator nor the ECC single bit correction indicator is asserted (e.g. if both remain at a logic level zero), the ECC error detection circuitry 16 did not detect an error.

ECC error correction circuitry 18 provides the corrected Dout. In the case that no error is indicated by ECC error detection circuitry 16, the raw Dout is provided as corrected Dout to the requestor in response to the read access request. Alternatively, raw Dout can be provided directly from memory 12 or from ECC error detection circuitry 16 to the requestor in response to the read access request. In the case that ECC single bit correction indicator is asserted, ECC error detection circuitry 16 also provides the flipped bit location to ECC error correction circuitry 18. For example, this can be provided as a bit vector in which only the bit location in the vector corresponding to the bit error in raw Dout is asserted. In this manner, ECC error correction circuitry 18 can flip or toggle the appropriate bit of raw Dout and provide this data value as corrected Dout.

As described above, if the ECC circuitry (including ECC detection circuitry 16 and ECC error correction circuitry 18) fails (i.e. is not operating correctly), damaging errors may occur in any system utilizing memory system 10. For example, due to the failure of ECC error detection circuitry 16 or ECC error correction circuitry 18, ECC error correction circuitry 18 may correct raw Dout incorrectly or when no correction is needed. In another example, ECC error correction circuitry 18 may correct raw Dout to provide corrected Dout without ECC error detection circuitry 16 indicating the occurrence of such correction (i.e. without asserting the ECC single bit correction indicator). In yet another example, ECC error detection circuitry 16 may indicate a correction is needed for raw Dout, but ECC error correction circuitry 18 does not perform the correction. These failures can result, for example, in the provision of incorrect read data or incorrect indicators to the requestor. Therefore, ECC operation checking circuitry 20, based on the corrected Dout, raw Dout, and the ECC single bit correction indicator, provides an ECC wrong correction indicator, which, when asserted, indicates that the ECC circuitry has made a wrong correction (and thus is not operating correctly).

Figures 2, 3:
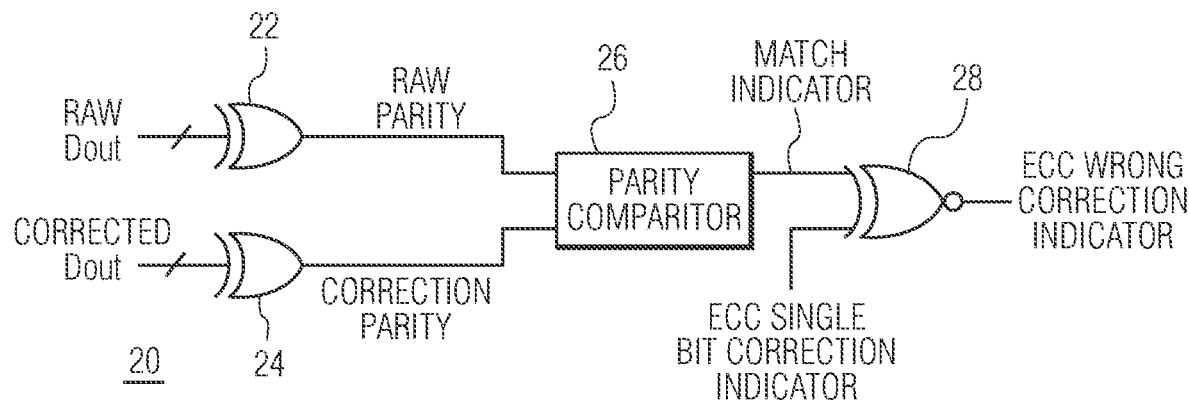
FIG. 2 illustrates, in partial schematic and partial block diagram form, the ECC operation checking circuitry of FIG. 1, in accordance with one embodiment of the present invention.
FIG. 3 illustrates a table showing example values for the ECC operation checking circuitry, in accordance with one embodiment of the present invention.

FIG. 2 illustrates, in partial block diagram and partial schematic form, further details of ECC operation checking circuitry 20, in accordance with one embodiment of the present invention. ECC operation checking circuitry includes XOR gates 22 and 24, and XNOR gate 28, as well as a parity comparator 26. XOR gate 22 receives raw Dout from memory 12 and performs an XOR operation on the bits in raw Dout. For example, if raw Dout is 8 bits, then each of the 8 bits is provided as an input to XOR gate 22. The same is true for XOR 24 which receives corrected Dout and performs an XOR operation on the bits in corrected Dout. Raw parity is asserted to a logic level one when raw Dout has an odd number of 1's and negated otherwise. Similarly, correction parity is asserted to a logic level one when corrected Dout has an odd number of 1's and negated otherwise. Note that any logic circuit or combination of logic gates may be used in place of each of XOR gates 22 and 24 or in place of both XOR gates 22 and 24 to perform the XOR functions or the parity calculations. Therefore, XOR gates 22 and 24 may be referred to as parity determination circuitry.

Parity comparator 26 determines whether the raw parity matches the correction parity and provides a match indicator. If the raw and correction parities match (both have an odd number of ones or neither has an odd number of ones), match indicator is asserted to a logic level one. XNOR gate 28 performs an XNOR function on the match indicator and the ECC single bit correction indicator to provide the ECC wrong correction indicator. Alternate embodiments may use any logic circuit or combination of logic gates to perform the XNOR function and to provide the appropriate value of the ECC wrong correction indicator. Note that with correct operation of the ECC circuitry, if the raw Dout and corrected Dout match in value, then no single bit error should be indicated (i.e. ECC single bit correction indicator should be a logic level zero). Likewise, if the raw Dout and corrected Dout do not match in value, then a single bit error should be indicated (i.e. should be a logic level one). Therefore, using the values of raw Dout, corrected Dout, and the ECC single bit correction indicator, it can be determined whether the ECC circuitry is operating as intended.

Note than rather performing full comparisons between raw Dout and corrected Dout to make the determination of whether raw Dout and corrected Dout match, comparisons between the parity of raw Dout and the parity of corrected Dout can be made instead. This comparison works in the case that there is not a multibit error (such as when the ECC multibit error indicator is a logic level zero). The circuitry required to implement the parity comparisons (e.g. XOR gates 22 and 24, as well as one-bit comparator 26) is far smaller than the circuitry required to do full data comparisons.

Operation of ECC operation checking circuitry 20 is further described in reference to table 30 of FIG. 3. Table 30 gives 4 different examples for the operation of ECC operation checking circuitry 20 in rows 32, 34, 36, and 38, each row corresponding to one example. All the values in rows 32, 34, 36, and 38 in table 30 correspond to binary values. (Note that herein, the symbol "%" preceding a number indicates that the number is represented in its binary or base two form.) Further, for simplicity, while the data size provided by memory 12 in response to each read access request may be larger (such as a word which is typically 2 bytes or 4 bytes), only the 4 lower significant bits are shown in the examples of table 30, in which the remaining higher significant bits for each raw Dout and corrected Dout of table 30 are all assumed to be zero for these examples. (For each row in table 30, it is also assumed that the ECC multibit error indicator is negated.) With respect to the example of row 32, it is assumed that for a read access to memory 12, raw Dout includes %1000 (corresponding to a decimal value of 8) and corrected Dout from ECC error correction circuitry 18 is also %1000. In row 32, ECC error detection circuitry 16 provides the ECC single bit correction indicator as false (as a logic level zero), indicating no single bit error. In this case, the parities of both raw Dout and corrected Dout (each corresponding to a logic level one) match, resulting in match indicator being a logic level one. When the match indicator is XNORed with the ECC single bit error correction indicator (a logic level zero), the result is a logic level zero for the ECC wrong correction indicator, which indicates that the ECC circuitry (the combination of ECC error detection circuitry 16 and ECC error correction circuitry 18) provided the expected result for performing its function of single bit error detection and correction.

With respect to the example of row 38, it is assumed that for a read access to memory 12, raw Dout is %1000 (corresponding to a decimal value of 8) and corrected Dout from ECC error correction circuitry 18 is %1001 (corresponding to a decimal value of 9). In row 38, ECC error detection circuitry 16 provides ECC single bit correction indicator as true (as a logic level one), indicating a single bit error was detected by ECC error detection circuitry 16 and thus corrected by ECC error correction circuitry 18. In this case, the parity of raw Dout (a logic level one) and the parity of corrected Dout (logic level zero) do not match, resulting in match indicator being a logic level zero. When the match indicator is XNORed with the ECC single bit error correction indicator (logic level one), the result is a logic level zero for the ECC wrong correction indicator, which also indicates, as with row 32, that the ECC circuitry (the combination of ECC error detection circuitry 16 and ECC error correction circuitry 18) provided the expected result for performing its function of single bit error detection and correction.

However, rows 34 and 36 each provide examples in which operation of the ECC circuitry does not provide the expected results. With respect to the example of row 34, it is assumed that for a read access to memory 12, raw Dout is %1000 (corresponding to a decimal value of 8) and corrected Dout from ECC error correction circuitry 18 is %1001 (corresponding to a decimal value of 9). In row 34, ECC error detection circuitry 16 provides the ECC single bit correction indicator as false (as a logic level zero), indicating a single bit error was not detected by ECC error detection circuitry 16. In this case, the parity of raw Dout (logic level one) and the parity of corrected Dout (logic level zero) do not match, resulting in match indicator being a logic level zero. When the match indicator is XNORed with the ECC single bit error correction indicator (logic level zero), the result is a logic level one for the ECC wrong correction indicator (indicating a wrong correction was performed). Since the raw Dout and corrected Dout do not match, there should have been an ECC single bit correction indicated, but there was not. Therefore, in this case, the ECC circuitry did not operate correctly.

Similarly, with respect to the example of row 36, it is assumed that for a read access to memory 12, raw Dout is %1000 (corresponding to a decimal value of 8) and corrected Dout from ECC error correction circuitry 18 is also %1000. In row 36, ECC error detection circuitry 16 provides the ECC single bit correction indicator as true (as a logic level one), indicating a single bit error was detected by ECC error detection circuitry 16. In this case, the parity of raw Dout (logic level one) and the parity of corrected Dout (logic level one) do match, resulting in match indicator being a logic level one. When the match indicator is XNORed with the ECC single bit error correction indicator (logic level one), the result is a logic level one for the ECC wrong correction indicator (indicating a wrong correction was performed). Since the raw Dout and corrected Dout match, there should have been no ECC single bit correction indicated, but there was. Therefore, in this case, the ECC circuitry did not operate correctly.

By now it can be appreciated how ECC operation checking circuitry 20 is able to provide an indication as to whether the ECC circuitry for its corresponding memory is operating correctly or not. The use of ECC operation checking circuitry 20 does not interfere with the normal operation of the ECC circuitry and therefore this testing may be done throughout normal operation of memory system 10. This mechanism to test the operation of the ECC circuitry also does not require intensive and costly software, nor does it require a full duplication of the ECC circuitry as is done using lockstep testing. For example, for lockstep testing of ECC circuitry, each ECC operation is performed twice (using ECC circuitry and the duplicated ECC circuitry) and compared. Also, ECC operation checking circuitry 20 as described herein provides for a diverse testing function, in that it uses a different algorithm to check operation of the ECC circuitry than the ECC algorithm itself used by the ECC circuitry. For example, ECC operation checking circuitry 20 does not use the ECC checkbits to perform its testing, as is done with EDC after ECC testing, but instead uses a parity calculation on the raw data and corrected data, combined with the single bit error detection indicator. Furthermore, in using the parity calculation on the raw and corrected data, the size and cost of the additional hardware for this testing may be minimized.

The terms "assert" or "set" and "negate" (or "deassert" or "clear") are used herein when referring to the rendering of a signal, status bit, or similar apparatus into its logically true or logically false state, respectively. If the logically true state is a logic level one (i.e. a logic level one), the logically false state is a logic level zero (i.e. a logic level zero). And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Thus, it is to be understood that the architectures depicted herein are merely exemplary, and that in fact many other architectures can be implemented which achieve the same functionality. Also for example, in one embodiment, the illustrated elements of memory system 10 are circuitry located on a single integrated circuit or within a same device, and may be on the same integrated circuit as other modules.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different logic using any combination of logic gates may be used to obtain the parity calculations on the raw data and corrected data, as well as to determine the value of the ECC wrong correction indicator based on the parities and the ECC single bit correction indicator. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a system includes error detection circuitry configured to receive raw read data from a memory, perform error detection in accordance with a single-bit error correction and double-bit error detection (SECDEC) error-correction code (ECC) on the raw read data, and provide a single bit correction indicator in response to performing the SECDEC ECC on the raw read data and a flipped bit location indicator when a single bit error is detected; error correction circuitry configured to provide corrected read data corresponding to the raw read data based at least on the single bit correction indicator; and ECC checking circuitry configured to generate a wrong operation indicator based at least on a parity of the raw read data, a parity of the corrected read data, and the single bit correction indicator, wherein the ECC checking circuitry is configured to assert the wrong operation indicator when at least one of the error detection circuitry or the error correction circuitry is not operating correctly. In one aspect of this embodiment, the ECC checking circuitry comprises comparison circuitry which compares the parity of the raw read data and the parity of the corrected raw read data to provide a match indicator, and the wrong operation indicator is based on the match indicator and the single bit correction indicator. In a further aspect, the ECC checking circuitry comprises parity determination circuitry which determines the parity of the raw read data as a first one-bit value and determines the parity of the corrected read data as a second one-bit value. In another further aspect, the ECC checking circuitry is devoid of comparison circuitry which performs a full comparison of the raw read data and the corrected read data. In another aspect of the above embodiment, the ECC checking circuitry is configured to assert the wrong operation indicator when the parity of the raw read data and the parity of the corrected read data match in value and the single bit correction indicator is asserted to indicate occurrence of a single bit correction in the raw read data. In yet another aspect, the ECC checking circuitry is configured to assert the wrong operation indicator when the parity of the raw read data and the parity of the corrected read data do not match in value and the single bit correction indicator is negated to indicate no occurrence of a single bit correction in the raw read data. In yet another aspect, the ECC checking circuitry is configured to negate the wrong operation indicator to indicate correct operation of the error detection circuitry and error correction circuitry when the parity of the raw read data and the parity of the corrected read data match in value and the single bit correction indicator is negated to indicate no occurrence of a single bit correction in the raw read data. In yet another aspect, the ECC checking circuitry is configured to negate the wrong operation indicator to indicate correct operation of the error detection circuitry and the error correction circuitry when the parity of the raw read data and the parity of the corrected read data do not match in value and the single bit correction indicator is asserted to indicate occurrence of a single bit correction in the raw read data. In yet another aspect, wherein the error detection circuitry is configured to receive checkbits corresponding to the raw read data from the memory, wherein the error detection circuitry is configured to use the checkbits and the raw read data to perform the error detection in accordance with the SECDEC ECC. In a further aspect, the wrong operation indicator is generated by the ECC checking circuitry without using the corresponding checkbits. In yet another aspect of the above embodiment, the error detection circuitry is configured to provide a multibit error detection indicator and wherein the ECC checking circuitry is configured to provide the wrong operation indicator when the ECC multibit error indicator is negated to indicate no occurrence of a multibit error. In another aspect, the error correction circuitry is configured to correct the read data to provide the corrected read data using the flipped bit location indicator when the single bit correction indicator is asserted to indicate occurrence of a single bit error and configured to provide the raw read data as the corrected read data when the single bit correction indicator is negated.

In another embodiment, a method includes receiving raw read data from a memory in response to a read access request; receiving checkbits corresponding to the raw read data; performing error detection in accordance with a single-bit error correction and double-bit error detection (SECDEC) error-correction code (ECC) on the raw read data using the corresponding checkbits, wherein the error detection is performed by ECC circuitry; providing a single bit correction indicator by the ECC circuitry in response to performing the error detection; providing corrected read data by the ECC circuitry corresponding to the raw read data based at least on the single bit correction indicator; determining a parity of the raw read data and a parity of the corrected read data; and generating a wrong operation indicator which indicates correct or incorrect operation of the ECC circuitry based on the parity of the raw read data, the parity of the corrected read data, and the single bit correction indicator. In one aspect of the another embodiment, the generating the wrong operation indicator does not include performing a full comparison between the raw read data and the corrected read data. In another aspect, when the single bit correction indicator indicates occurrence of a single bit error in the raw read data, the ECC circuitry flips one bit in the raw read data to provide as the corrected read data, and when the single bit correction indicator indicates no occurrence of the single bit error in the raw data, the ECC circuitry provides the raw read data as the corrected read data. In yet another aspect, the providing the wrong operation indicator comprises asserting the wrong operation indicator to indicate incorrect operation of the ECC circuitry when the parity of the raw read data and the parity of the corrected read data match in value and the single bit correction indicator is asserted to indicate occurrence of a single bit correction in the raw read data. In yet another aspect, the providing the wrong operation indicator comprises asserting the wrong operation indicator to indicate incorrect operation of the ECC circuitry when the parity of the raw read data and the parity of the corrected read data do not match in value and the single bit correction indicator is negated to indicate no occurrence of a single bit correction in the raw read data. In yet another aspect, the providing the wrong operation indicator comprises negating the wrong operation indicator to indicate correct operation of the ECC circuitry when the parity of the raw read data and the parity of the corrected read data match in value and the single bit correction indicator is negated to indicate no occurrence of a single bit correction in the raw read data. In yet another aspect, the providing the wrong operation indicator comprises negating the wrong operation indicator to indicate correct operation of the ECC circuitry when the parity of the raw read data and the parity of the corrected read data do not match in value and the single bit correction indicator is asserted to indicate occurrence of a single bit correction in the raw read data. In yet another aspect, the generating the wrong operation indicator is performed without using the corresponding checkbits.

What is claimed is:

1. A system comprising:
   error detection circuitry configured to receive raw read data from a memory, perform error detection in accordance with a single-bit error correction and double-bit error detection (SECDEC) error-correction code (ECC) on the raw read data, and provide a single bit correction indicator in response to performing the SECDEC ECC on the raw read data and a flipped bit location indicator when a single bit error is detected;
   error correction circuitry configured to provide corrected read data corresponding to the raw read data based at least on the single bit correction indicator;
   ECC checking circuitry configured to generate a wrong operation indicator based at least on a parity of the raw read data, a parity of the corrected read data, and the single bit correction indicator, wherein the ECC checking circuitry is configured to assert the wrong operation indicator when at least one of the error detection circuitry or the error correction circuitry is not operating correctly.

2. The system of claim 1, wherein the ECC checking circuitry comprises comparison circuitry which compares the parity of the raw read data and the parity of the corrected raw read data to provide a match indicator, and the wrong operation indicator is based on the match indicator and the single bit correction indicator.

3. The system of claim 2, wherein the ECC checking circuitry comprises parity determination circuitry which determines the parity of the raw read data as a first one-bit value and determines the parity of the corrected read data as a second one-bit value.

4. The system of claim 2, wherein the ECC checking circuitry is devoid of comparison circuitry which performs a full comparison of the raw read data and the corrected read data.

5. The system of claim 1, wherein the ECC checking circuitry is configured to assert the wrong operation indicator when the parity of the raw read data and the parity of the corrected read data match in value and the single bit correction indicator is asserted to indicate occurrence of a single bit correction in the raw read data.

6. The system of claim 1, wherein the ECC checking circuitry is configured to assert the wrong operation indicator when the parity of the raw read data and the parity of the corrected read data do not match in value and the single bit correction indicator is negated to indicate no occurrence of a single bit correction in the raw read data.

7. The system of claim 1, wherein the ECC checking circuitry is configured to negate the wrong operation indicator to indicate correct operation of the error detection circuitry and error correction circuitry when the parity of the raw read data and the parity of the corrected read data match in value and the single bit correction indicator is negated to indicate no occurrence of a single bit correction in the raw read data.

8. The system of claim 1, wherein the ECC checking circuitry is configured to negate the wrong operation indicator to indicate correct operation of the error detection circuitry and the error correction circuitry when the parity of the raw read data and the parity of the corrected read data do not match in value and the single bit correction indicator is asserted to indicate occurrence of a single bit correction in the raw read data.

9. The system of claim 1, wherein the error detection circuitry is configured to receive checkbits corresponding to the raw read data from the memory, wherein the error detection circuitry is configured to use the checkbits and the raw read data to perform the error detection in accordance with the SECDEC ECC.

10. The system of claim 9, wherein the wrong operation indicator is generated by the ECC checking circuitry without using the corresponding checkbits.

11. The system of claim 1, wherein the error detection circuitry is configured to provide a multibit error detection indicator and wherein the ECC checking circuitry is configured to provide the wrong operation indicator when the ECC multibit error indicator is negated to indicate no occurrence of a multibit error.

12. The system of claim 1, wherein the error correction circuitry is configured to correct the read data to provide the corrected read data using the flipped bit location indicator when the single bit correction indicator is asserted to indicate occurrence of a single bit error and configured to provide the raw read data as the corrected read data when the single bit correction indicator is negated.

13. A method comprising:
   receiving raw read data from a memory in response to a read access request;
   receiving checkbits corresponding to the raw read data;
   performing error detection in accordance with a single-bit error correction and double-bit error detection (SECDEC) error-correction code (ECC) on the raw read data using the corresponding checkbits, wherein the error detection is performed by ECC circuitry;

providing a single bit correction indicator by the ECC circuitry in response to performing the error detection;

providing corrected read data by the ECC circuitry corresponding to the raw read data based at least on the single bit correction indicator;

determining a parity of the raw read data and a parity of the corrected read data; and generating a wrong operation indicator which indicates correct or incorrect operation of the ECC circuitry based on the parity of the raw read data, the parity of the corrected read data, and the single bit correction indicator.

14. The method of claim 13, wherein the generating the wrong operation indicator does not include performing a full comparison between the raw read data and the corrected read data.

15. The method of claim 13, wherein when the single bit correction indicator indicates occurrence of a single bit error in the raw read data, the ECC circuitry flips one bit in the raw read data to provide as the corrected read data, and when the single bit correction indicator indicates no occurrence of the single bit error in the raw data, the ECC circuitry provides the raw read data as the corrected read data.

16. The method of claim 13, wherein the providing the wrong operation indicator comprises asserting the wrong operation indicator to indicate incorrect operation of the ECC circuitry when the parity of the raw read data and the parity of the corrected read data match in value and the single bit correction indicator is asserted to indicate occurrence of a single bit correction in the raw read data.

17. The method of claim 13, wherein the providing the wrong operation indicator comprises asserting the wrong operation indicator to indicate incorrect operation of the ECC circuitry when the parity of the raw read data and the parity of the corrected read data do not match in value and the single bit correction indicator is negated to indicate no occurrence of a single bit correction in the raw read data.

18. The method of claim 13, wherein the providing the wrong operation indicator comprises negating the wrong operation indicator to indicate correct operation of the ECC circuitry when the parity of the raw read data and the parity of the corrected read data match in value and the single bit correction indicator is negated to indicate no occurrence of a single bit correction in the raw read data.

19. The method of claim 13, wherein the providing the wrong operation indicator comprises negating the wrong operation indicator to indicate correct operation of the ECC circuitry when the parity of the raw read data and the parity of the corrected read data do not match in value and the single bit correction indicator is asserted to indicate occurrence of a single bit correction in the raw read data.

20. The method of claim 13, wherein the generating the wrong operation indicator is performed without using the corresponding checkbits.

\* \* \* \* \*